(12) United States Patent
Tang et al.

(10) Patent No.: US 8,884,658 B2
(45) Date of Patent: Nov. 11, 2014

(54) INVERTER WITH PARALLEL POWER DEVICES

(71) Applicant: Atieva, Inc., Redwood City, CA (US)

(72) Inventors: Yifan Tang, Redwood City, CA (US); Anh Phung, Redwood City, CA (US)

(73) Assignee: ATIEVA, Inc., Redwood City, CA (US)

( * ) Notice: Subject to any disclaimer, the term of this patent is extended or adjusted under 35 U.S.C. 154(b) by 0 days.

(21) Appl. No.: 13/842,458

(22) Filed: Mar. 15, 2013

(65) Prior Publication Data
US 2014/0266325 A1 Sep. 18, 2014

(51) Int. Cl.
*H03B 1/00* (2006.01)
*H03K 3/00* (2006.01)
*H03K 17/60* (2006.01)

(52) U.S. Cl.
CPC .................................. *H03K 17/602* (2013.01)
USPC ............................ 327/108; 327/109; 327/112

(58) Field of Classification Search
CPC ................................................ H03K 17/04123
USPC .......................................... 327/108, 109, 112
See application file for complete search history.

(56) References Cited

U.S. PATENT DOCUMENTS

| | | | |
|---|---|---|---|
| 4,667,178 A * | 5/1987 | Ryu | 341/136 |
| 6,870,253 B1 | 3/2005 | Ushijima | |
| 6,884,953 B2 | 4/2005 | Nii | |
| 2006/0261864 A1 * | 11/2006 | Miyazawa | 327/112 |

FOREIGN PATENT DOCUMENTS

| | | |
|---|---|---|
| JP | 2003002546 | 1/2003 |
| JP | 2005354864 | 12/2005 |
| KR | 1020090054738 | 6/2009 |

OTHER PUBLICATIONS

International Search Report, PCT/US2014/028601, mailed Jul. 1, 2014.

* cited by examiner

*Primary Examiner* — John Poos
(74) *Attorney, Agent, or Firm* — Womble, Carlyle, Sandridge & Rice

(57) ABSTRACT

A power drive apparatus is provided. The apparatus includes a first switch having a first plurality of power devices arranged in a back to back configuration within adjacent stacked rows of the first switch. The apparatus includes a second switch having a second plurality of power devices arranged in a back to back configuration within adjacent stacked rows of the second switch. A bus is shared with the first switch and the second switch. The apparatus includes a control drive device coupled to a gate of each power device of the first plurality of power devices and each power device of the second plurality of power devices.

22 Claims, 6 Drawing Sheets

INVERTER WITH PARALLEL POWER DEVICES

BACKGROUND

Power modules can be used to drive electric motors in electric and hybrid vehicles and other applications. Frequently, a power module has many individual power devices in parallel, for greater current capacity than the individual power device has in isolation. One way to parallel connect power devices, such as integrated gate bipolar transistors, field effect transistors or bipolar transistors or other power devices, is to run long bus bars and connect each of the power devices to the bus bars. Long bus bars typically have large parasitic inductance and parasitic resistance, which can give rise to ringing and loss of efficiency.

It is within this context that the embodiments arise.

SUMMARY

In one embodiment, a power drive apparatus is provided. The apparatus includes a first switch having a first plurality of power devices arranged in a back to back configuration within adjacent stacked rows of the first switch. The apparatus includes a second switch having a second plurality of power devices arranged in a back to back configuration within adjacent stacked rows of the second switch. A bus is shared with the first switch and the second switch. The apparatus includes a control drive device coupled to a gate of each power device of the first plurality of power devices and each power device of the second plurality of power devices.

In another embodiment, a power module is provided. The power module includes a first bus bar, configured to couple to a negative DC voltage supply and a second bus bar, configured to couple to a positive DC voltage supply. The power module includes a three-pronged bus bar having a first outer prong, a middle prong and a second outer prong. The first bus bar is located between the first outer prong and the middle prong, and the second bus bar located between the middle prong and the second outer prong. The power module includes a first plurality of power devices, a first terminal of each of the first plurality of power devices coupled to the first outer prong, a second terminal of each of the first plurality of power devices coupled to the first bus bar. The power module includes a second plurality of power devices, a first terminal of each of the second plurality of power devices coupled to the middle prong, a second terminal of each of the second plurality of power devices coupled to the first bus bar. The power module includes a third plurality of power devices, a first terminal of each of the third plurality of power devices coupled to the second bus bar, a second terminal of each of the third plurality of power devices coupled to the middle prong. The bus bar includes a fourth plurality of power devices, a first terminal of each of the fourth plurality of power devices coupled to the second bus bar, a second terminal of each of the fourth plurality of power devices coupled to the second outer prong.

In yet another embodiment, a printed circuit board assembly is provided. The printed circuit board assembly includes a printed circuit board having a first trace, a second trace and a third trace. The printed circuit board includes a first plurality of power devices aligned with each other in a first row, where a first terminal of each of the first plurality of power devices is coupled to the third trace, and where a second terminal of each of the first plurality of power devices is coupled to the first trace. The printed circuit board includes a second plurality of power devices aligned with each other in a second row, where a first terminal of each of the second plurality of power devices is coupled to the third trace, and where a second terminal of each of the second plurality of power devices is coupled to the first trace. The printed circuit board includes a third plurality of power devices aligned with each other in a third row, where a first terminal of each of the third plurality of power devices is coupled to the second trace, and where a second terminal of each of the third plurality of power devices is coupled to the third trace. The printed circuit board includes a fourth plurality of power devices aligned with each other in a fourth row, where a first terminal of each of the fourth plurality of power devices is coupled to the second trace, and where a second terminal of each of the fourth plurality of power devices is coupled to the third trace. The first row, the second row, the third row, and the fourth row are parallel to each other.

In another embodiment, a method of delivering power is provided. The method includes activating a first plurality of power devices of a first switch where the first plurality of power devices are arranged in a back to back configuration along stacked rows of the first switch. The method includes activating a second plurality of power devices of a second switch where the second plurality of power devices are arranged in a back to back configuration along stacked rows of the second switch. The method includes drawing power from a portion of the first plurality of power devices and from a portion of the second plurality of power devices over a bus bar shared by the first plurality of power device and the second plurality of power devices. In some embodiments, the portion of the first plurality of power devices are coupled to a first surface of the shared bus bar and the portion of the second plurality of power devices are coupled to an opposed surface of the shared bus bar.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
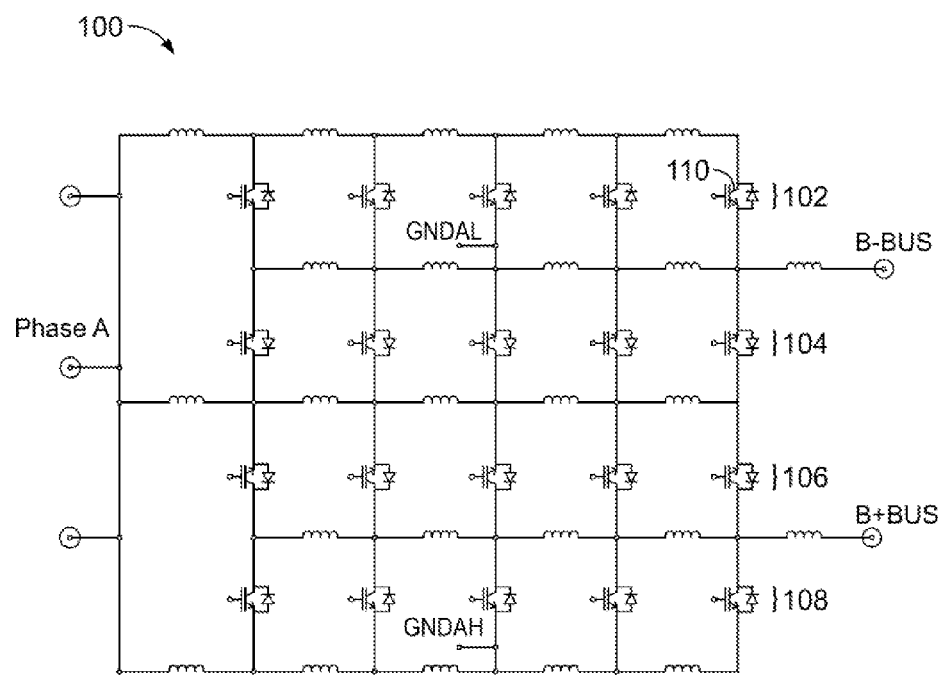
FIG. 1 is a schematic diagram of a power driver circuit, with power devices arranged in parallel rows in accordance with some embodiments.

A power module has a printed circuit board (PCB) layout that lowers parasitic inductance and parasitic resistance as compared to long, parallel layouts. A long parallel layout would have all of the power devices in a long, single row. Folding this row into four stacked rows of power devices places the power devices back-to-back on shared conductors. The present power module has groups of power devices in four rows, and uses wide, shorter bus bars to couple the power devices to the direct current (DC) and alternating current (AC) terminals of the power module in some embodiments. These wide, shorter bus bars in this embodiment have less parasitic inductance and less parasitic resistance than the long conductors used in a long, parallel layout. The reduced parasitic inductance decreases ringing in the circuit. In addition, reduced parasitic inductance and reduced parasitic resistance reduce power losses. Grouping the power devices in four rows allows production of a printed circuit board that has a more compact form factor, i.e., is closer to square in aspect ratio, as compared to a long, parallel layout without the folded rows with a back to back configuration of the power devices along adjacent rows. This compact form factor enables packaging efficiencies. Additionally, groups of resistors couple a control device to individual control terminals of the power devices. These groups of resistors allow tuning of the resistance between the control device and each individual control terminal. Paths to the individual control terminals are substantially equal in length and matched impedance, prior to the tuning in some embodiments.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

A power driver circuit 100 is shown in FIG. 1 in accordance with some embodiments. In the power driver circuit 100, power devices 110 are arranged in four rows 102, 104, 106, and 108. Each power device 110 is, or includes, an integrated gate bipolar transistor (IGBT) in this embodiment. In variations, a field effect transistor (FET) could be used as a power device. The power driver circuit 100 can be used to provide one phase power, e.g., the phase A power, in the form of AC (alternating current) voltage and current, to a multiple-phase electric motor in an electric or hybrid vehicle. DC (direct current) power is provided to the power driver circuit 100 through the B− Bus terminal, which is coupled to a negative DC voltage supply, and the B+ Bus terminal, which is coupled to a positive DC voltage supply. Each of the rows 102, 104, 106, and 108 is shown as having five power devices 110, so that there are 10 power devices 110 coupling the B− Bus terminal and the Phase A terminal, and 10 power devices 110 coupling the B+ Bus terminal and the Phase A terminal. The power devices 110 of rows 102 and 104 may be referred to as a first switch, while the power devices 110 of rows 106 and 108 may be referred to as a second switch. In this embodiment, the first and second switches share or have in common a conductor or bus. In variations, other numbers of power devices can be used as FIG. 1 is an example and not meant to be limiting. It should be appreciated that the hybrid or electric vehicle mentioned herein may be land, sea, or air based and is not limited to electric automobiles.

Still referring to FIG. 1, the IGBTs in row 102 have each of their collectors coupled to the Phase A terminal by a conductor (top row of Phase A), which is shown as having parasitic inductors. The emitters of the IGBTs in row 102 are coupled to the B− Bus terminal by another conductor, which is also shown as having parasitic inductors. In the embodiment shown, Phase A has three terminal connectors (shown on the left side of the FIG. 1 schematic). IGBTs in row 104 are back-to-back with the IGBTs in row 102. The IGBTs in row 104 all have their emitters coupled to the B− Bus terminal by the same conductor that couples the B− Bus terminal to the emitters of the IGBTs in row 102. The IGBTs in row 104 have their collectors coupled to the Phase A terminal by another conductor (middle row of Phase A), shown as having parasitic inductors. The IGBTs in row 104 are thus coupled in parallel to the IGBTs in row 102. The IGBTs in rows 102 and 104 provide the negative DC current from the B− Bus terminal to the Phase A terminal.

Continuing with FIG. 1, similarly grouped set of power devices in rows 106 and 108 provides the positive DC current from the B+ Bus terminal to the Phase A terminal. Because the B+ Bus terminal has the opposite polarity of the B− Bus terminal, the power devices in rows 106 and 108 are oriented oppositely to the power devices in rows 102 and 104. That is, emitter and collector connections are reversed in rows 106 and 108 as compared to these connections in the rows 102 and 104. Emitters in the IGBTs of row 106 are coupled to the Phase A terminal by the same conductor (middle row of Phase A) as couples the collectors of the IGBTs of row 104 to the Phase A terminal. The collectors of the IGBTs of row 106 are coupled to the B+ Bus terminal by another conductor, shown as having parasitic inductors. IGBTs in row 108 are back-to-back with the IGBTs in row 106. The IGBTs in row 108 all have their collectors coupled to the B+ Bus terminal by the same conductor as couples the B+ Bus terminal to the collectors of the IGBTs in row 106. The IGBTs in row 108 have their emitters coupled to the Phase A terminal by another conductor (bottom row of Phase A), shown as having parasitic inductors. The IGBTs in row 108 are thus coupled in parallel to the IGBTs in row 106.

Figure 2:
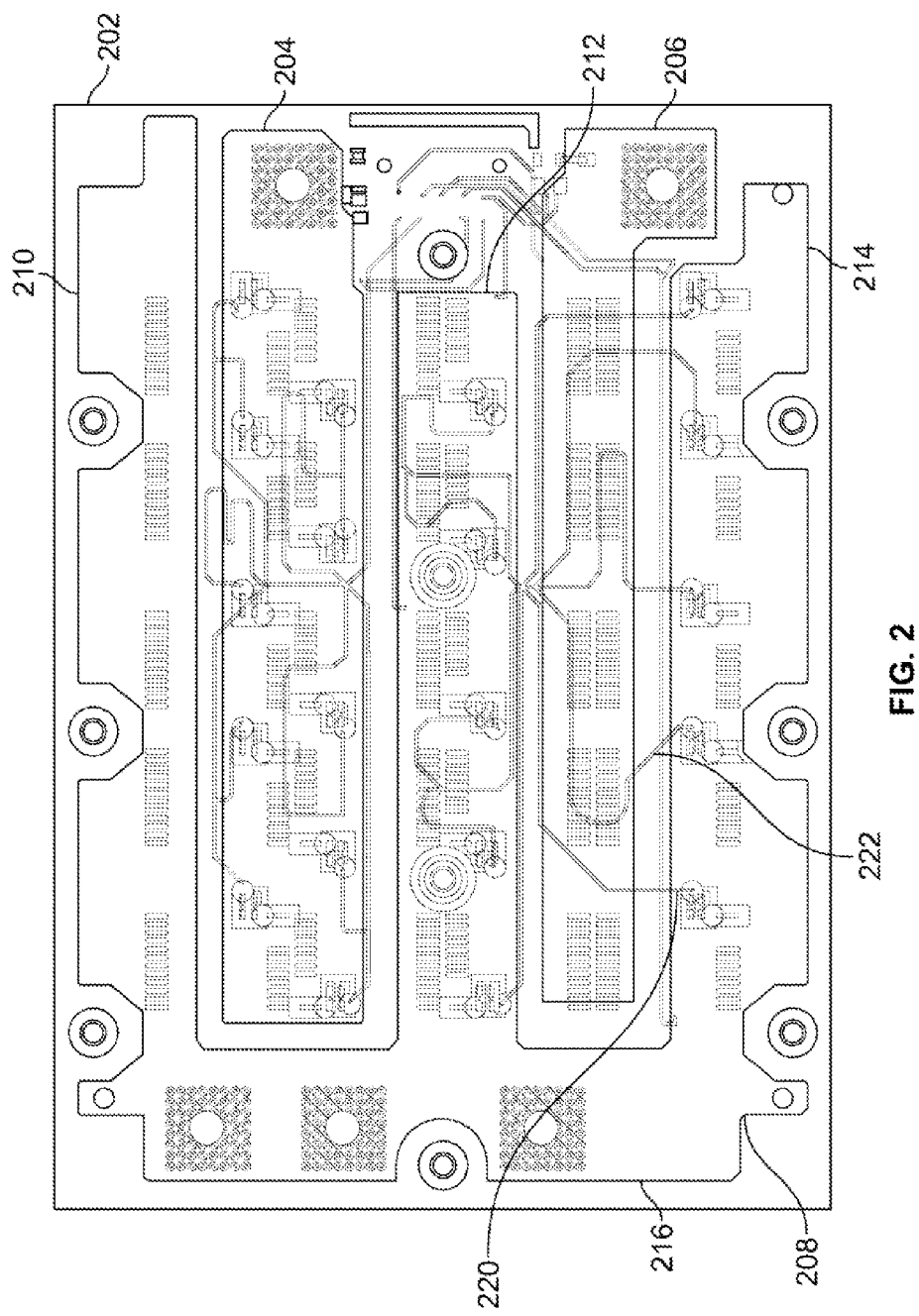
FIG. 2 is a top view of a printed circuit board, showing traces that implement bus bars and equal length traces, for the power driver circuit of FIG. 1 in accordance with some embodiments.

The schematic diagram a FIG. 1 is implemented with the printed circuit board of FIG. 2. More specifically, the circuit of the schematic diagram of FIG. 1 is implemented when the printed circuit board of FIG. 2 is populated, producing a printed circuit board assembly. The printed circuit board of FIG. 2 implements the connections of the schematic diagram of FIG. 1. In the embodiments shown, there is a physical correspondence between the arrangement of the power devices 110 on the schematic of FIG. 1 and on the printed circuit board of FIG. 2. On the printed circuit board 202 of FIG. 2, the power devices are mounted closely spaced, for example within a few millimeters of each other in some embodiments. It should be appreciated that pairs of back-to-back close-proximity connected power devices have much smaller parasitic inductance in the connection path between the pair, than the parasitic inductance of the conductor path that connects to an adjacent pair of back-to-back connected power devices. Such parasitic inductance between any back-to-back connected power devices is negligible and hence not shown in FIG. 1, whereas the conductor portions that join the pairs together are each represented by a parasitic inductor.

Each of the major conductor paths of the power driver circuit 100 is shown as a relatively wide trace on the printed circuit board 202 of FIG. 2. The conductive wide trace can be made of copper even though other conductive materials may be used. It should be appreciated that the wide trace reduces parasitic inductance inherent in the transient current carrying conductor path. These wide traces act as bus bars to couple the power devices to the terminals of the power driver circuit 100. The close proximity of pairs of back-to-back power devices also helps to reduce the parasitic inductances between the adjacent pairs and hence reducing the overall parasitic inductances. Bus bar 204 couples to the B– Bus terminal and bus bar 206 couples to the B– Bus terminal. A three-pronged bus bar 208 couples to the Phase A terminal. The three-pronged bus bar 208 is made up of a bus bar segment 210 as a first outer prong, a bus bar segment 212 as a middle prong, and a bus bar segment 214 as a second outer prong, with bus bar segment 216 coupling bus bar segments 210, 212, and 214. The IGBTs, or other power devices, are placed onto the printed circuit board 202 with proper orientation and connection so as to implement the power driver circuit 100 of FIG. 1. A first row of power devices couples to the bus bar segment 210 and bus bar 204. A second row of power devices couples to bus bar 204 and bus bar 212. A third row of power devices couples to bus bar 212 and bus bar 206. A fourth row of power devices couples to bus bar 206 and bus bar 214. It should be appreciated that bus bars 204 and 206 may be referred to as being interleaved with the three prongs of bus bar 208 in this embodiment.

The bus bar 204 thus acts as a shared conductor for the back-to-back power devices of a switch that includes the first and second rows 102 and 104, coupling these devices to the B-Bus terminal. The bus bar 206 acts as a shared conductor for the back-to-back power devices of a switch that includes the third and fourth rows 106 and 108, coupling these devices to the B+ Bus terminal. The fourth bus bar 212, i.e., the middle prong of the three-pronged bus bar 208, acts as a shared conductor for the power devices of the second and third rows 104 and 106, coupling these devices to the Phase A terminal. These shared conductors support the folding of what would be a single, linear array of power devices into the four stacked rows. In one embodiment, the lengths of the bus bars are matched to within a ratio of three to four, inclusive. That is, each bus bar is no shorter than three quarters the length of any other bus bar. In one embodiment, the widths of the bus bars are matched to within a ratio of one to two, inclusive. That is, each bus bar is no narrower than half the width of any other bus bar. Substantially equal length traces 220 and 222 couple to the individual gate terminals of the IGBTs, i.e., to the individual control terminals of the power devices. That is, each IGBT has a gate terminal coupled to a respective one of the substantially equal length traces 220 and 222. The substantially equal length traces 220 and 222 are further discussed with regard to control devices and the schematics of FIGS. 6 and 7.

Figure 3:
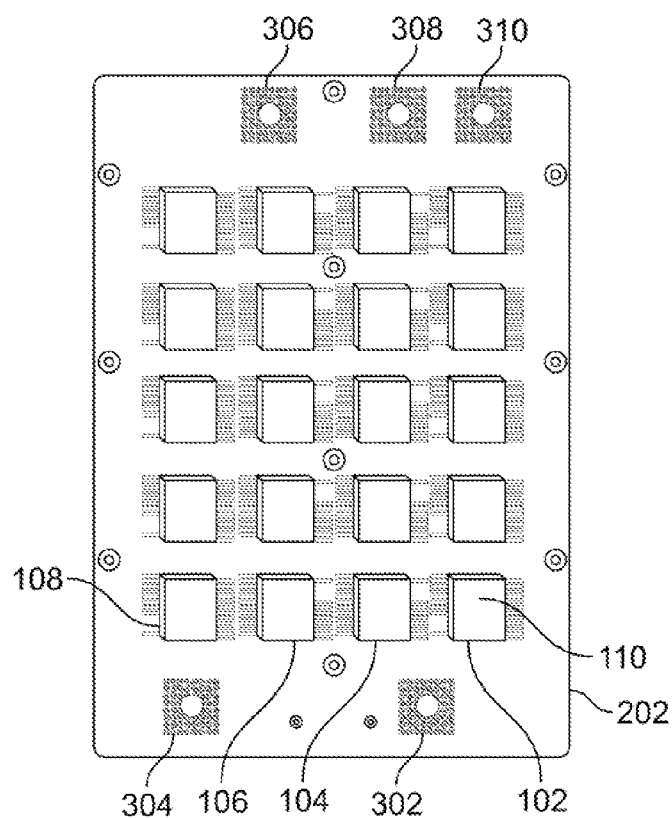
FIG. 3 is a top view of a printed circuit board assembly, in which the power driver circuit of FIG. 1 is implemented by populating the printed circuit board of FIG. 2 in accordance with some embodiments.

FIG. 3 shows the printed circuit board assembly, with power devices 110 arranged in the first row 102, the second row 104, the third row 106 and the fourth row 108 in accordance with one embodiment. The B– Bus terminal connector 302 and the B+ Bus terminal connector 304 are located at one end of the printed circuit board 202. Three Phase A terminal connectors 306, 308, and 310 are located at an opposed second end of the printed circuit board 202. The printed circuit board assembly has a compact, rectangular form with an aspect ratio less than two to one, i.e., with a length less than twice as long as the width of the printed circuit board, in one embodiment.

Figure 4:
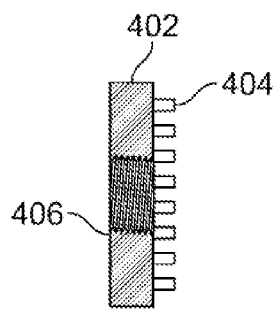
FIG. 4 is a side view of a terminal connector for the printed circuit board assembly in accordance with some embodiments.

FIG. 4 shows a side view of a terminal connector 402 that can be used with the first circuit board assembly of FIG. 3 in accordance with one embodiment. In variations, other types of terminal connectors could be used. The terminal connector 402 has pins 404 extending from one face of the terminal connector. A threaded aperture 406 extends through the terminal connector 402. It is optional that the aperture is threaded.

Figure 5:
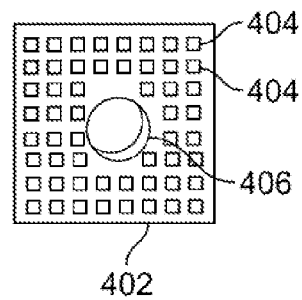
FIG. 5 is a bottom view of the terminal connector in accordance with some embodiments

FIG. 5 has a front view of the terminal connector of FIG. 4 in accordance with one embodiment. The pins 404 are shown surrounding the threaded aperture 406. The pins 404 are dimensioned to fit into corresponding holes in the printed circuit board of FIG. 2 in some embodiments. In one embodiment, the pins are press fitted into the printed circuit board. The pins could also be soldered into the printed circuit board, with or without a press fit. For example, the terminal connector 402 can be installed into the right end of the first bus bar 204, the right end of the second bus bar 206, or the three locations on the sixth bus bar 216 of FIG. 2. In one embodiment, there are five of these terminal connectors 402, installed into the five above-described locations on the printed circuit board 202, with one at each location.

Figure 6:
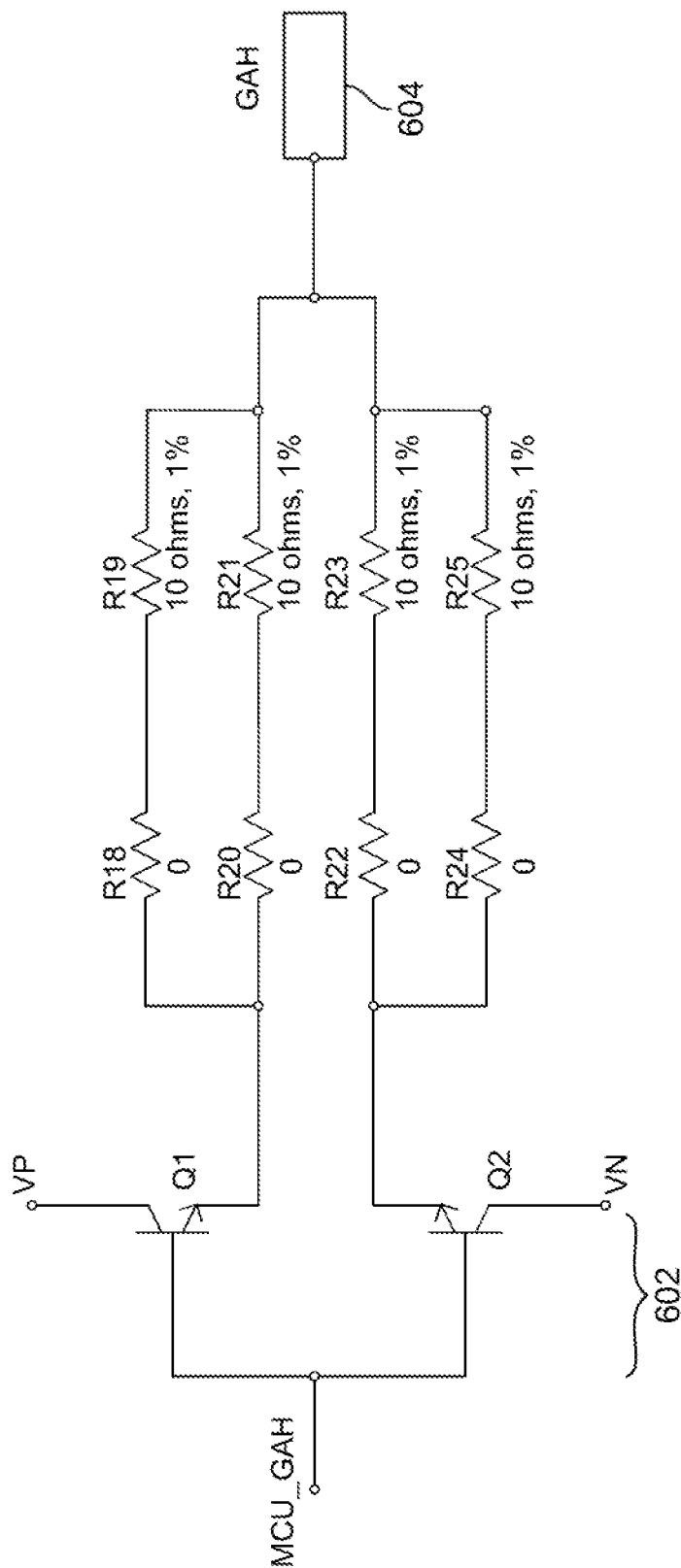
FIG. 6 is a schematic diagram of a control device, with resistors coupled to a group control terminal in accordance with some embodiments.

FIG. 6 shows the control device 602 that provides a control signal to the control terminals of the power devices. In one embodiment, there are two of the control devices 602, e.g., one control device for each of the switches of the power control circuit. One of the control devices 602 sends a pulse width modulation signal that turns on all of the power devices 110 in rows 106 and 108 of FIG. 1 to shape the positive lobe of the AC voltage on the Phase A terminal in some embodiments. These power devices 110 (in rows 106 and 108) are turned off during the negative lobe of this AC voltage. A different control device 602 sends a pulse width modulation signal that turns on all of the power devices 110 in rows 102 and 104 to shape the negative lobe of the AC voltage on the Phase A terminal. These power devices 110 (in rows 102 and 104) are turned off during the positive lobe of this AC voltage.

Thus, one of control device 602 provides a control signal to the gates of the IGBTs in rows 102 and 104 of FIG. 1, while a second control device 602 provides a control signal to the gates of the IGBTs in rows 106 and 108 of FIG. 1. Groups of resistors, shown in FIGS. 6 and 7, couple the control devices 602 to the gates of the IGBTs. The groups of resistors can be tuned by removing one of the resistors, or bridging across one of the resistors, e.g., by soldering in a jumper on a printed circuit board. It should be appreciated that tuning the groups of resistors allows fine-tuning of the delay from the control devices 602 to the gates of the individual IGBTs, as well as fine-tuning of the switching on and off speeds of individual IGBTs. In addition, tuning can compensate for variations in performance among the IGBTs. Any of the resistors could also be replaced by another resistor of a different value, for tuning. For example, an IGBT with a slightly slower response than others could have a resistor bridged in the path to the gate of the IGBT in order to decrease the RC (resistor capacitor) time delay in the control signal, or have lower resistance value resistors in its gate drive signal path. A faster IGBT could have higher resistance value resistors in the path to the gate of the IGBT in order to increase the RC time delay in the control signal. It should be appreciated that the embodiments provide for numerous variations to adjust the time delay and switching on and off speeds for each IGBT independently.

Continuing with FIG. 6, the control device 602 has a pullup device Q1 and a pulldown device Q2. In this embodiment, Q1 is a NPN BJT (NPN type bipolar junction transistor), and Q2 is a PNP BJT (PNP type bipolar junction resistor). Other types of pullup devices and pulldown devices could be used. In the embodiment shown in FIG. 6, the output of the pullup device Q1 and the output of the pulldown device Q2 are not immediately coupled to each other. Instead, the output of the pullup device Q1 and the output of the pulldown device Q2 are coupled to a group control terminal 604 through groups of the resistors R18-R25, which allow fine-tuning of the pullup path and the pulldown path along the way to the group control terminal 604. Thus, one group of resistors R18, R19, R20, and R21 allows fine-tuning of the pullup path resistance so that the switch turn on time delay and switch rise time can be adjusted, for the switch that the control terminal 604 is connected to whereas the switch is comprised of multiple power devices in parallel as described. Another group of resistors R22, R23, R24, and R25 allows fine-tuning of the pulldown path resistance so that the switch turnoff time delay and switch fall time can be adjusted independently of the turn on time delay and the rise time, for the same switch that the control terminal 604 is connected to. In the embodiment shown, the resistors in the pullup path are grouped as two branches in parallel, with each branch having two resistors in series. The resistors in the pulldown path are grouped similarly. In further embodiments, the pull-up device Q1 and the pulldown device Q2 could be immediately coupled to each other, and other groupings of tuning resistors could be devised. Alternatively, the tuning resistors could be omitted in favor of a direct coupling of the control device and the individual control terminals of the power devices.

Figure 7:
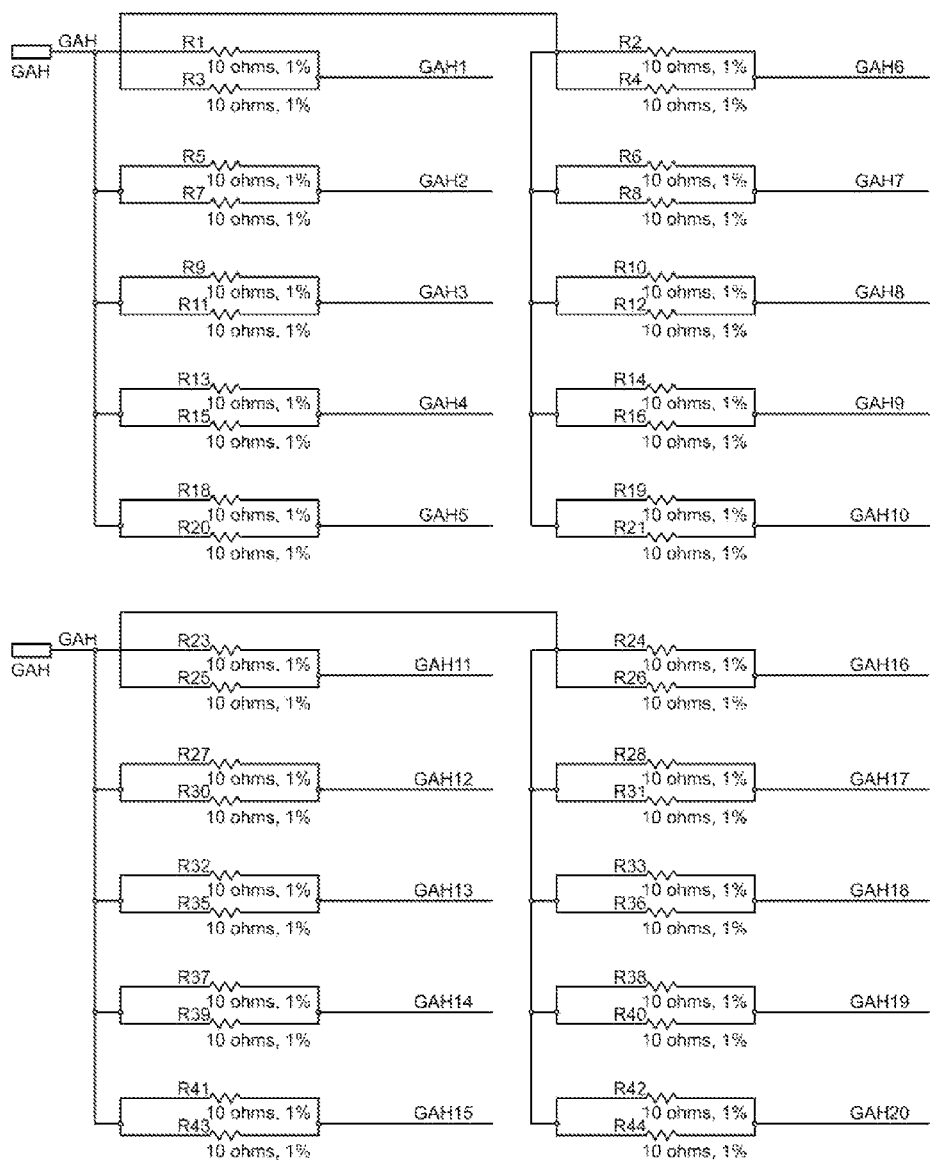
FIG. 7 is a schematic diagram of resistors coupling group control terminals to individual control terminals of the power devices of FIG. 1 in accordance with some embodiments.

In FIG. 7, the paths from the group control terminals 604 to the individual gate terminals of the IGBTs are shown. One control device 602 provides a control signal to the group control terminal GAH associated with the positive DC voltage supply, and another control device 602 provides a control signal to the group control terminal GAL associated with the negative DC voltage supply. The upper half of FIG. 7 shows the paths from the group control terminal GAH to the individual gate terminals GAH1, GAH2, GAH3, GAH4, GAH5 of a third row of power devices and from the group control terminal GAH to the individual gate terminals GAH6, GAH7, GAH8, GAH9, GAH10 of a fourth row of power devices. In one embodiment, the third row and the fourth row of power devices form a second switch as mentioned with reference to FIG. 1. Each of these paths has two resistors in parallel and each of these paths includes a substantially equal length path to the gate terminal of the respective IGBT. Removal, bridging or replacement of any of these resistors allows fine-tuning of the resistance on the path from the group control terminal to the gate of the IGBT.

Similarly, the lower half of FIG. 7 shows the paths from the group control terminal GAL to the individual gate terminals GAL1, GAL2, GAL3, GAL4, GAL5 of a first row of power devices and from the group control terminal GAL to the individual gate terminals GAL6, GAL7, GAL8, GAL9, and GAL10 of a second row of power devices. For example, the first and second rows may make up a first switch on the lower half of the power driver circuit as illustrated in FIG. 1. Each of these paths has two resistors in parallel and each of these paths includes a substantially equal length path to the gate terminal of the respective IGBT. In one embodiment, the equal length paths are matched to within about 10%. That is, the length of each path is within about 90% to 110% of the length of any other of the paths. Removal, bridging or replacement of any of these resistors allows fine-tuning of the resistance on the path from the group control terminal to the gate of the IGBT.

The above-described power driver circuit, printed circuit board and printed circuit board assembly thus provide multiple IGBTs in parallel connection to form the upper and lower switches of a half-bridge inverter leg. Variations in the layout of the printed circuit board are readily devised for various packages and types of power devices. Interconnection of the parallel devices minimizes the parasitic inductances. These parasitic inductances can contribute to switching overshoots, ringing, electromagnetic interference noise and power loss. The power trace layouts on the power module printed circuit board achieve balanced copper bus bar heating and minimize trace resistances. The gate drive signal layout and gate resistor allocations enhance synchronous switching of all devices forming a switch. The embodiments reduce the ringing among the power devices as well as ringing among the gate drive circuits. The gate resistor allocation allows independent and individual adjustment of switching on and switching off speeds of individual devices to enhance synchronous switching. Multiple power terminals are mounted on the power modules, in one embodiment on opposite ends of the power module printed circuit board. In some embodiments, the power devices are mounted on one surface of the printed circuit board, and the power terminal connectors are mounted on the opposite surface of the printed circuit board. In various embodiments, the power terminal connectors are made of copper or brass, with zinc or lead or other plating, although the connectors may be composed of any suitable conductive metal. The power terminal connectors in one embodiment contain multiple conductive pins that mate with through-holes on the printed circuit board. In the embodiment shown, each of the power terminal connectors has an optional center threaded mounting hole.

Figure 8:
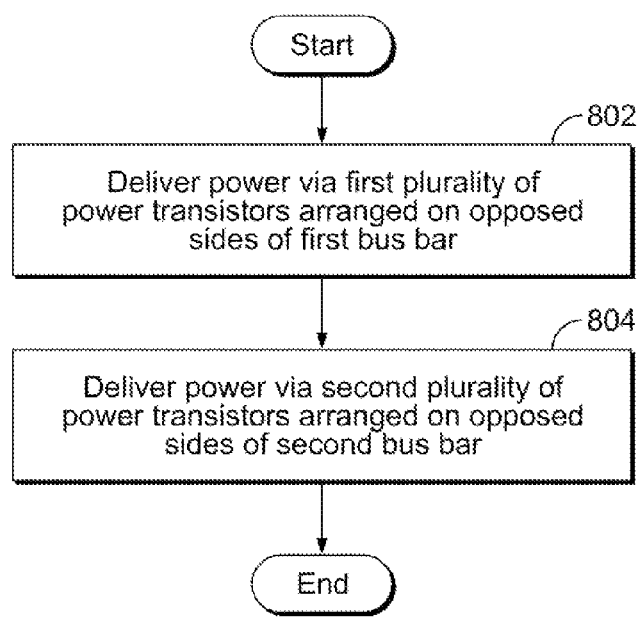
FIG. 8 is a flow diagram of a method of delivering power from power devices in accordance with some embodiments.

FIG. 8 shows a method of delivering power from power transistors. The method can be practiced using embodiments shown in FIGS. 1-7. In an action 802, power is delivered via a first plurality of power devices, also referred to as power transistors, arranged on opposed sides of a first bus bar. For example, power can be delivered from a negative DC voltage terminal such as the B− Bus terminal of FIG. 1. The power can be delivered via the first and second rows, i.e., a first switch, of power devices. These power devices can be arranged back-to-back on opposed sides of a first bus bar, as shown in FIG. 2. The power devices are coupled to the B− Bus terminal via the first bus bar. In an action 804, power is delivered via a second plurality of power transistors arranged on opposed sides of a second bus bar. For example, power can be delivered from a positive DC voltage terminal such as the B+ Bus terminal of FIG. 1. The power can be delivered via the third and fourth rows. i.e., a second switch, of power devices. These power devices can be arranged back-to-back on opposed sides of the second bus bar 206, as shown in FIG. 2. The power devices are coupled to the B+ Bus terminal via the second bus bar 206.

In one embodiment of the method of FIG. 8, a portion of the power delivered via the first plurality of power devices and the second plurality of power devices is delivered via a third bus bar, that is shared with the first plurality of power devices and the second plurality of power devices. In some embodiments the portion of the first plurality of power devices are coupled to a first surface of the shared bus bar and the portion of the second plurality of power devices are coupled to an opposed surface of the shared bus bar as illustrated in FIGS. 1 and 2. For example, the power can be delivered by bus bar 212 from FIG. 2 in one embodiment, where bus bar 212 is located between the first plurality of power transistors and the second plurality of power transistors. A portion of the first plurality of power transistors is coupled to bus bar 212, namely the second row 104 (see FIG. 1) of power devices is coupled to the bus bar 212. A portion of the second plurality of power transistors is coupled to bus bar 212, namely the third row 106 (see FIG. 1) of power devices is coupled to the bus bar 212.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The embodiments can also be embodied as computer readable code on a computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including handheld devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A power drive apparatus, comprising:
    a first switch having a first plurality of power devices arranged in a back to back configuration within adjacent stacked rows of the first switch, wherein the back to back configuration couples emitters of stacked power devices of the first switch;
    a second switch having a second plurality of power devices arranged in a back to back configuration within adjacent stacked rows of the second switch;
    a bus shared with the first switch and the second switch; and
    a control drive device coupled to a gate of each power device of the first plurality of power devices and each power device of the second plurality of power devices.

2. The power drive apparatus of claim 1, wherein each power device of the first plurality of power devices and each power device of the second plurality of power devices includes an integrated gate bipolar transistor or a field effect transistor.

3. The power drive apparatus of claim 1, wherein adjacent stacked rows of one of the first switch or the second switch couple interleaved bus bars to each other.

4. The power drive apparatus of claim 1, wherein the back to back configuration couples collectors of stacked power devices of the second switch.

5. The power drive apparatus of claim 1, wherein the control device is operable to independently control each gate of each power device.

6. The power drive apparatus of claim 5, wherein a resistance between the control device and each gate of each power device can be tuned.

7. A power module, comprising:
    a first bus bar, configured to couple to a negative DC voltage supply;
    a second bus bar, configured to couple to a positive DC voltage supply;
    a three-pronged bus bar, the three-pronged bus bar having a first outer prong, a middle prong and a second outer prong, the first bus bar located between the first outer prong and the middle prong, the second bus bar located between the middle prong and the second outer prong;
    a first plurality of power devices, a first terminal of each of the first plurality of power devices coupled to the first outer prong, a second terminal of each of the first plurality of power devices coupled to the first bus bar;

a second plurality of power devices, a first terminal of each of the second plurality of power devices coupled to the middle prong, a second terminal of each of the second plurality of power devices coupled to the first bus bar;

a third plurality of power devices, a first terminal of each of the third plurality of power devices coupled to the second bus bar, a second terminal of each of the third plurality of power devices coupled to the middle prong; and a fourth plurality of power devices, a first terminal of each of the fourth plurality of power devices coupled to the second bus bar, a second terminal of each of the fourth plurality of power devices coupled to the second outer prong.

8. The power module of claim 7, further comprising:
a printed circuit board, wherein the first bus bar, the second bus bar, and the three-pronged bus bar are included in the printed circuit board.

9. The power module of claim 7, further comprising:
a first pullup device;
a first pulldown device;
a first plurality of resistors coupling the first pullup device to a first group control terminal;
a second plurality of resistors coupling the first pulldown device to the first group control terminal;
a third plurality of resistors coupling the first group control terminal to the first plurality of power devices;
a fourth plurality of resistors coupling the first group control terminal to the second plurality of power devices;
a second pullup device;
a second pulldown device;
a fifth plurality of resistors coupling the second pullup device to a second group control terminal;
a sixth plurality of resistors coupling the second pulldown device to the second group control terminal;
a seventh plurality of resistors coupling the second group control terminal to the third plurality of power devices; and
an eighth plurality of resistors coupling the second group control terminal to the fourth plurality of power devices.

10. The power module of claim 9, wherein any of the first plurality of resistors, the second plurality of resistors, the third plurality of resistors, the fourth plurality of resistors, the fifth plurality of resistors, the sixth plurality of resistors, the seventh plurality of resistors, and the eighth plurality of resistors can be independently tuned.

11. The power module of claim 7, wherein:
the first plurality of power devices is in a first row;
the second plurality of power devices is in a second row, the second row adjacent to and parallel to the first row;
the third plurality of power devices is in a third row, the third row adjacent to and parallel to the second row;
the fourth plurality of power devices is in a fourth row, the fourth row adjacent to and parallel to the third row; and
first plurality of power devices, the second plurality of power devices, the third plurality of power devices, and the fourth plurality of power devices are in adjacent, stacked, parallel-row arrangement.

12. A printed circuit board assembly, comprising:
a printed circuit board having a first trace, a second trace and a third trace;
a first plurality of power devices aligned with each other in a first row, a first terminal of each of the first plurality of power devices coupled to the third trace, a second terminal of each of the first plurality of power devices coupled to the first trace;

a second plurality of power devices aligned with each other in a second row, a first terminal of each of the second plurality of power devices coupled to the third trace, a second terminal of each of the second plurality of power devices coupled to the first trace;

a third plurality of power devices aligned with each other in a third row, a first terminal of each of the third plurality of power devices coupled to the second trace, a second terminal of each of the third plurality of power devices coupled to the third trace; and a fourth plurality of power devices aligned with each other in a fourth row, a first terminal of each of the fourth plurality of power devices coupled to the second trace, a second terminal of each of the fourth plurality of power devices coupled to the third trace, wherein the first row, the second row, the third row, and the fourth row are parallel to each other.

13. The printed circuit board assembly of claim 12, wherein:
the third trace has a first branch, a second branch, and a third branch; and
the first branch, the first trace, the second branch, the second trace, and the third branch are in interleaved arrangement.

14. The printed circuit board assembly of claim 12, wherein a switching on speed and a switching off speed for each power device of each of the plurality of power devices is independently adjustable.

15. The printed circuit board assembly of claim 12, further comprising:
a first power terminal connector coupled to the first trace;
a second power terminal connector coupled to the second trace;
a third power terminal connector coupled to the third trace;
a fourth power terminal connector coupled to the third trace; and
a fifth power terminal connector coupled to the third trace.

16. The printed circuit board assembly of claim 15, wherein:
the first power terminal and the second power terminal are at a first end of the printed circuit board; and
the third power terminal, the fourth power terminal, and the fifth power terminal are at an opposed second end of the printed circuit board.

17. The printed circuit board assembly of claim 12, further comprising:
a plurality of power terminal connectors coupled to the first trace, the second trace and the third trace;
at least one of the plurality of terminal connectors having a plurality of pins that are press fitted or soldered into the printed circuit board.

18. The printed circuit board assembly of claim 12, further comprising:
a further printed circuit board having a first control device and a second control device;
a first plurality of resistors coupling the first control device to a first group control terminal;
a first plurality of equal-length traces coupled to the first group control terminal, each equal-length trace of the first plurality of equal-length traces coupling to an individual control terminal of a power device of the first plurality of power devices;
a second plurality of equal-length traces coupled to the first group control terminal, each equal-length trace of the second plurality of equal-length traces coupling to an individual control terminal of a power device of the second plurality of power devices;

a second plurality of resistors coupling the second control device to a second group control terminal;

a third plurality of equal-length traces coupled to the second group control terminal, each equal-length trace of the third plurality of equal-length traces coupling to an individual control terminal of a power device of the third plurality of power devices; and a fourth plurality of equal-length traces coupled to the second group control terminal, each equal-length trace of the fourth plurality of equal-length traces coupling to an individual control terminal of a power device of the fourth plurality of power devices.

19. The printed circuit board assembly of claim 18, wherein:

the first plurality of equal-length traces coupled to the first group control terminal includes a third plurality of resistors coupling the first plurality of equal-length traces to the first group control terminal;

the second plurality of equal-length traces coupled to the first group control terminal includes a fourth plurality of resistors coupling the second plurality of equal-length traces to the first group control terminal;

the third plurality of equal-length traces coupled to the second group control terminal includes a fifth plurality of resistors coupling the third plurality of equal-length traces to the second group control terminal; and the fourth plurality of equal-length traces coupled to the second group control terminal includes a sixth plurality of resistors coupling the fourth plurality of equal-length traces to the second group control terminal.

20. A method of delivering power from power transistors, the method comprising:

activating a first plurality of power devices of a first switch where the first plurality of power devices are arranged in a back to back configuration along stacked rows of the first switch, wherein during the activating of the first plurality of power devices, independently adjusting an activation time period for the first plurality of power devices;

activating a second plurality of power devices of a second switch where the second plurality of power devices are arranged in a back to back configuration along stacked rows of the second switch; and drawing power from a portion of the first plurality of power devices and from a portion of the second plurality of power devices over a bus bar shared by the first plurality of power device and the second plurality of power devices.

21. The method of claim 20 further comprising:

during the activating of the second plurality of power devices, independently adjusting an activation time period for the second plurality of power devices.

22. The method of claim 20, wherein the portion of the first plurality of power devices are coupled to a first surface of the shared bus bar and wherein the portion of the second plurality of power devices are coupled to an opposed surface of the shared bus bar.

* * * * *